United States Patent [19]
Farabaugh

[11] Patent Number: 5,604,465
[45] Date of Patent: Feb. 18, 1997

[54] ADAPTIVE SELF-CALIBRATION FOR FAST TUNING PHASELOCK LOOPS

[75] Inventor: Mark J. Farabaugh, Owego, N.Y.

[73] Assignee: International Business Machines Corporation, Armonk, N.Y.

[21] Appl. No.: 480,221

[22] Filed: Jun. 7, 1995

[51] Int. Cl.⁶ .................. H03L 7/93; H03L 7/107
[52] U.S. Cl. ............... 331/10; 331/16; 331/17; 331/25; 331/176
[58] Field of Search ................... 331/10, 11, 17, 331/16, 25, 176

[56] References Cited

U.S. PATENT DOCUMENTS

| | | | |
|---|---|---|---|
| 4,568,888 | 2/1986 | Kimura et al. | 331/10 |
| 4,929,918 | 5/1990 | Chung et al. | 331/10 |
| 5,027,087 | 6/1991 | Rottinghaus | 332/127 |
| 5,107,227 | 4/1992 | Brooks | 331/8 |
| 5,150,082 | 9/1992 | Grimmett et al. | 332/128 |
| 5,157,277 | 10/1992 | Tran et al. | 307/269 |
| 5,207,491 | 5/1993 | Rottinghaus | 331/16 |
| 5,334,952 | 8/1994 | Maddy et al. | 331/10 |
| 5,477,194 | 12/1995 | Nagakura | 331/10 |

*Primary Examiner*—Siegfried H. Grimm
*Attorney, Agent, or Firm*—Baker, Maxham, Jester & Meador

[57] ABSTRACT

Adaptive self-calibration of a radio tuner quickly compensates for temperature changes and other errors. The tuner includes a modified PLL with a reference signal generator to provide a reference signal with a desired frequency. A phase detector measures the phase difference between the reference signal and a feedback signal. An integrator integrates the phase detector's output signal over time and a summer sums the integrator's output signal along with an analog steering signal. The summer provides the summed output signal to an ICO that provides an output signal proportionate in frequency to the summed output signal. An amplifier uses the ICO's output signal to amplify an electromagnetic signal detected by an antenna. The amplifier provides its amplified signal to a demodulator and other circuitry of the tuner. The tuner additionally includes a divider connected between the ICO and the phase detector, to provide the feedback signal by dividing ICO's output signal by a predetermined number. The tuner also includes certain steering circuitry. During the initial operation of the tuner and in response to temperature and reference signal changes, a logic unit consults a memory device to select an analog pre-steering signal appropriate to the current reference signal and the current temperature. The logic unit provides this value to the summer for summing with the integrated signal. During ongoing operation of the tuner, the logic unit helps self-calibrate the tuner by sampling the integrator's output, and appropriately selecting a corrected steering signal to minimize the integrator's signal.

18 Claims, 5 Drawing Sheets

ADAPTIVE SELF-CALIBRATION FOR FAST TUNING PHASELOCK LOOPS

BACKGROUND OF THE INVENTION

1. Field of the Invention

The present invention relates to tuners for receiving electromagnetic signals such as radio frequency ("RF") signals. More particularly, the invention concerns a method and apparatus for adaptive self-calibration that quickly compensates for errors resulting from temperature changes and other causes.

2. Description of the Related Art

In the field of radio communications, a radio tuner generally operates to detect and amplify encoded signals received by an antenna coupled to the radio. People use radio tuners in a broad assortment of applications. Radio tuners are frequently found, for example, in commercial band FM or AM radios.

Additionally, radio tuners are frequently used in scanners. When employed in a scanner, a radio tuner incrementally advances through its frequency spectrum while searching for discernable radio signals. When the tuner identifies a radio signal, the tuner locks onto the identified signal until the user performs some action. For example, in a police band scanner, after detecting a radio signal the tuner locks onto the signal until the user initiates a new search for a different signal. Another example of a scanner is the "scan" function in automobile radios, where the tuner only locks onto one radio station for a moment before automatically advancing to the next station. Additionally, scanners are frequently employed in military applications such as radar warning receivers ("RWR"), early warning radar ("EWR"), and other monitoring devices. In military applications, the tuner only locks onto a signal long enough for processing circuitry to determine the nature of the signal, e.g. association with an enemy.

In many scanners, and especially military scanners, speed is critical. These scanners must be able to quickly and accurately detect a radio transmission and then advance to the next signal. In airborne EWR applications, for example, slow signal detection may provide insufficient advance notice to defeat enemy radar.

FIG. 1 illustrates a direct-selection tuner 100. With the direct-selection tuner 100, a digital selector 108 effectively determines the frequency of an output signal 104. The digital selector 108 provides a digital output signal responsive to its input 110. The digital selector 108 may comprise, for example, a mechanical tuning "knob" operated by a human user, or an electronic selector operated by various circuitry (not shown). The digital selector 108 therefore provides a digital signal representative of the desired output signal frequency, in response to the input 110. A digital-to-analog converter ("D/A") 106 converts this digital signal into its analog counterpart, which is fed to a voltage-controlled oscillator ("VCO") 102.

The VCO 102 then generates the output signal 104 having a frequency that is proportional to the analog signal from the D/A 106. The VCO 102 provides the output signal 104 to a down converter 112, connected to an antenna 114. The down converter 112 down-converts signals received from the antenna 114 in accordance with the output signal 104. The down converter 112 provides its output to other circuitry 116, including a demodulator.

Despite its simplicity, the direct-selection tuner 100 provides an adequate level of performance for many applications. A chief advantage of the tuner 100 is its quickness—the tuner 100 can lock onto a desired frequency as quickly as the digital selector 108 can provide the appropriate digital signal. However, the accuracy of the tuner 100 may be insufficient for certain users. If the tuner 100 is subjected to temperature changes, for example, its components may function differently than intended. Thus, a specific input 100 might fail to provide the intended value of output signal 104. This problem is especially vexing in airborne environments, where temperature necessarily fluxuates with altitude changes.

To overcome these problems, engineers have modified the tuner 100 by developing a pre-calibrated tuner 200, as illustrated in FIG. 2. More specifically, for a given temperature there may be a nonlinear relationship between the input 110 and the output signal 104. For instance, if the input 110 is advanced in uniform increments, the output signal 104 might not advance in correspondingly uniform increments. Optimally, when the digital selector 108 provides digital values of 100 units, 110 units, and 120 units, the resulting output signals 104 are 100 MHz, 110 MHz, and 120 MHz, respectively. However, the particular temperature at which the circuitry of the tuner 200 is operating may cause the tuner 200 to provide output signals 104 of 103 MHz, 115 MHz, and 135 MHz, instead.

To compensate for this problem, the pre-calibrated tuner 200 includes a memory 202 such as a programmable read only memory ("PROM"), which performs the functions of a lookup table. The lookup table stored in the memory 202 aids the digital selector 108 in selecting the digital output value. After consulting the lookup table in the memory 202, the digital selector 108 may output a digital value of 97 units, instead of 100 units, to provide the desired output signal 104 of 100 MHz.

Although the pre-calibrated tuner 200 provides a definite improvement over the direct-selection tuner 100, the tuner 200 still may not be completely satisfactory for some applications due to the lengthy calibrations that are required. To operate the tuner 200 at its peak of accuracy, a user must perform two calibration procedures: (1) a module-level linearity calibration, and (2) a system-level calibration.

The module-level calibration involves filling the memory 202 with digital lookup table values corresponding to each combination of temperature and desired output signal 104. In the system-lever calibration, the tuner 200 is operated to amplify a specific test signal that is fed to the antenna 114. This step exposes small variations that different electrical components of the system may experience in actual operation. If the tuner 200 does not lock onto the test signal as expected, the lookup table in the memory 202 is modified as necessary. The system-level calibration steps are repeated for each desired frequency of test signal.

Although the above-mentioned calibration procedures can achieve a reliable level of accuracy, they are time consuming. This may not be problematic for some users, but the required calibration time may be too long for others with sensitive applications; namely, during these lengthy calibration procedures the radio system is rendered inoperative.

In contrast to the tuners described above, some applications use a phase-locked loop ("PLL") tuner. FIG. 3 illustrates a tuner 300 that incorporates a typical PLL. The tuner 300 generally operates to maintain an output signal 302 in a specific phase relationship with an input signal 304. The tuner 300 includes a phase detector 306 to provide an output voltage proportional to the phase difference of the input signal 304 and a feedback signal 308. The phase detector 306 directs its output to a loop filter 310, which controls the dynamics of the tuner 300. The loop filter 310 directs its output to a VCO 312, which generates the output signal 302, providing the output signal 302 with a frequency that is proportionate to the magnitude of the input signal from the loop filter 310. The output signal 302 is fed back through a dividing circuit 314 to produce the feedback signal 308, which is an integer division of the output signal 302.

A down converter 316 uses the output signal 302 to amplify electromagnetic signals received by an antenna 318. The down converter 316 provides the amplified signals to other components 320 of the radio, such as a demodulator and other known circuitry.

Although using a PLL can provide certain advantages, PLL-based tuners are sometimes too slow for some applications. The PLL circuit exhibits an R-C time constant that lengthens the time required for the tuner to lock onto a signal. As a result, the tuner may require hundreds of microseconds to acquire a signal. Therefore, in applications requiring signal acquisition in tens of microseconds or less, PLL-based tuners are not completely satisfactory.

SUMMARY OF THE INVENTION

Broadly, the invention concerns a method and apparatus for adaptive self-calibration of a radio tuner that quickly compensates for errors resulting from temperature changes and other causes. Specifically, the invention consults a lookup table to obtain a pre-steering value corresponding to a desired tune frequency, A representative pre-steering signal is directed to an input controller oscillator ("ICO"), which produces an output signal having an actual tune frequency. For the current tune frequency, the invention detects any error, calculates and implements a corrected pre-steering value, and stores the corrected tune frequency for future rise.

One embodiment of the self-calibrating radio tuner of the invention includes a modified PLL, where a reference signal generator provides a reference signal of a selected frequency. A phase detector connected to the reference signal generator measures the phase difference between the reference signal and a feedback signal. An integrator, electrically connected to the phase detector, integrates the phase detector's output signal over time to provide an error signal. A summer is electrically connected to the integrator, and operates to sum the error signal win an analog steering signal. The summer provides the summed output signal to an ICO, which provides an output signal having an actual tune frequency proportionate to the amplitude of the summed output signal. A down converter uses the ICO's output signal to amplify an electromagnetic signal detected by an antenna. The down converter provides its amplified signal to a demodulator and other circuitry of the tuner.

The tuner additionally includes a divider connected between the ICO and the phase detector, to provide the feedback signal by dividing ICO's output signal by a predetermined number.

Additionally, the tuner includes certain steering circuitry. During the initial operation of the tuner, a logic unit consults a memory device to select an analog pre-steering signal appropriate to the current tune frequency. The logic unit provides this value to the summer, where it is summed with the error signal as discussed above. During ongoing operation of the tuner, the logic unit assists in self-calibrating the tuner. Specifically, the logic unit samples the error signal, and appropriately selects a corrected steering signal to minimize the error signal. Then, this new pre-steering value is stored for future use.

Accordingly, the invention provides its users with a number of distinct advantages. For example, the invention provides an automated, reliable, and accurate means of self-calibration for a radio tuner. Also, the radio tuner automatically compensates for detected changes due to ambient temperature and other factors. The radio tuner of the invention operates more efficiently than previous arrangements, since it avoids the time consuming module-level linearity calibration and system-level calibration procedures. Moreover, the pre-steering and steering functions of the invention assist the radio tuner in quickly acquiring its desired signal.

BRIEF DESCRIPTION OF THE DRAWINGS

The nature, objects, and advantages of the invention will become more apparent to those skilled in the art after considering the following detailed description in connection with the accompanying drawings, in which like reference numerals designate like parts throughout, wherein.

DETAILED DESCRIPTION OF THE PREFERRED EMBODIMENTS

As mentioned above, the present invention broadly concerns a self-calibrating radio tuner that uses a pre-acquisition steering signal to rapidly acquire a desired radio signal, and also adaptively compensates for errors that occur during the ongoing operation of the radio tuner.

STRUCTURE

Figure 1:
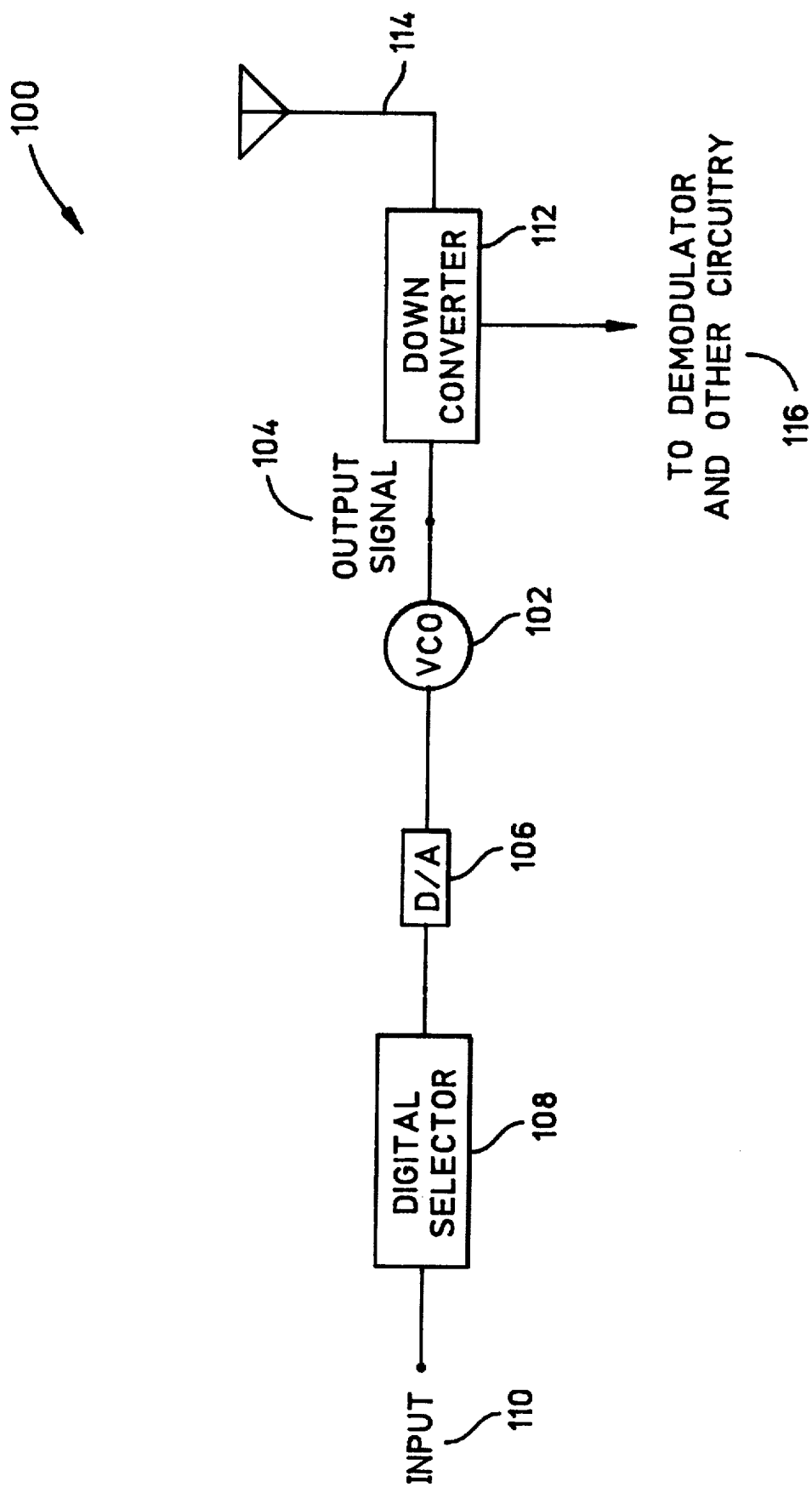
FIG. 1 is a block diagram of a typical direct selection tuner 100.
Figure 2:
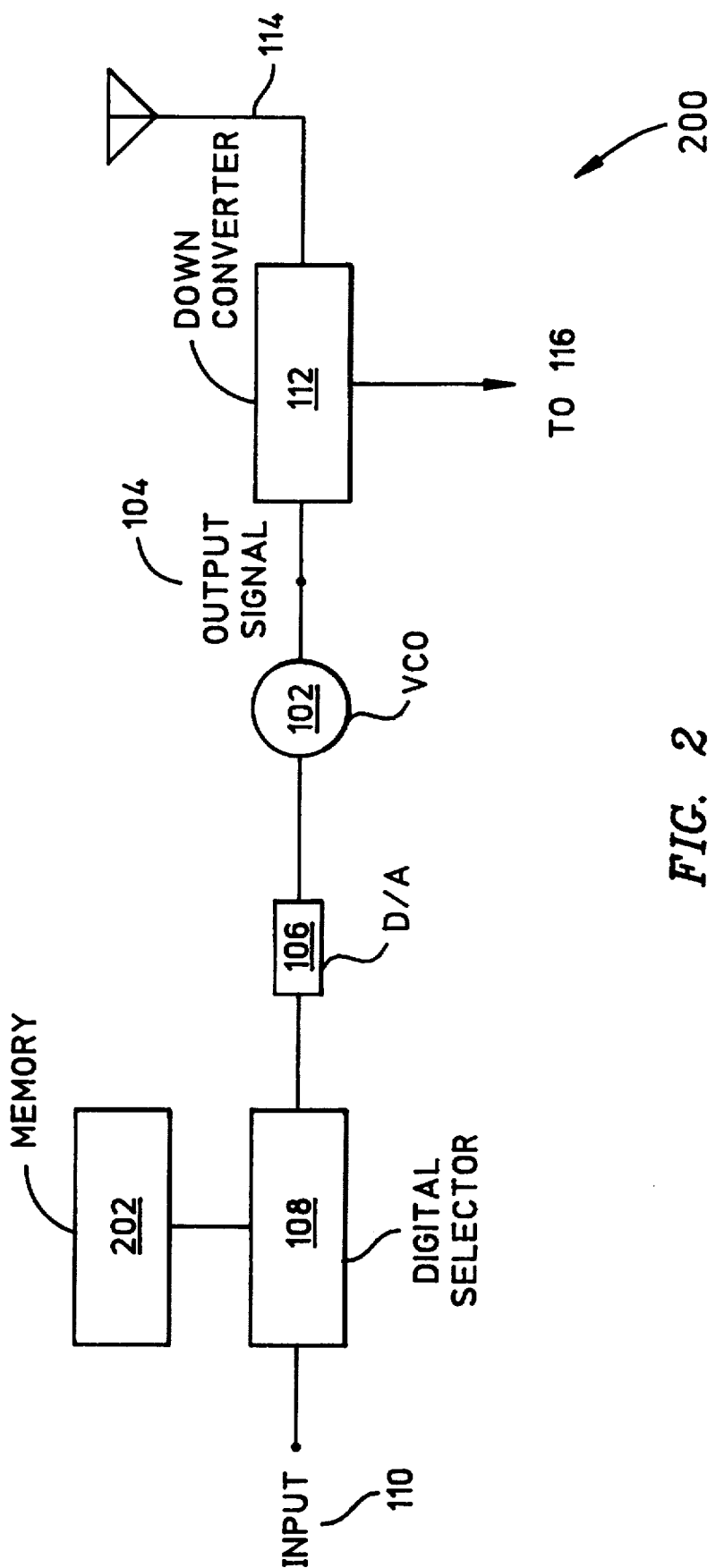
FIG. 2 is a block diagram of a pre-calibrated radio tuner 200.
Figure 3:
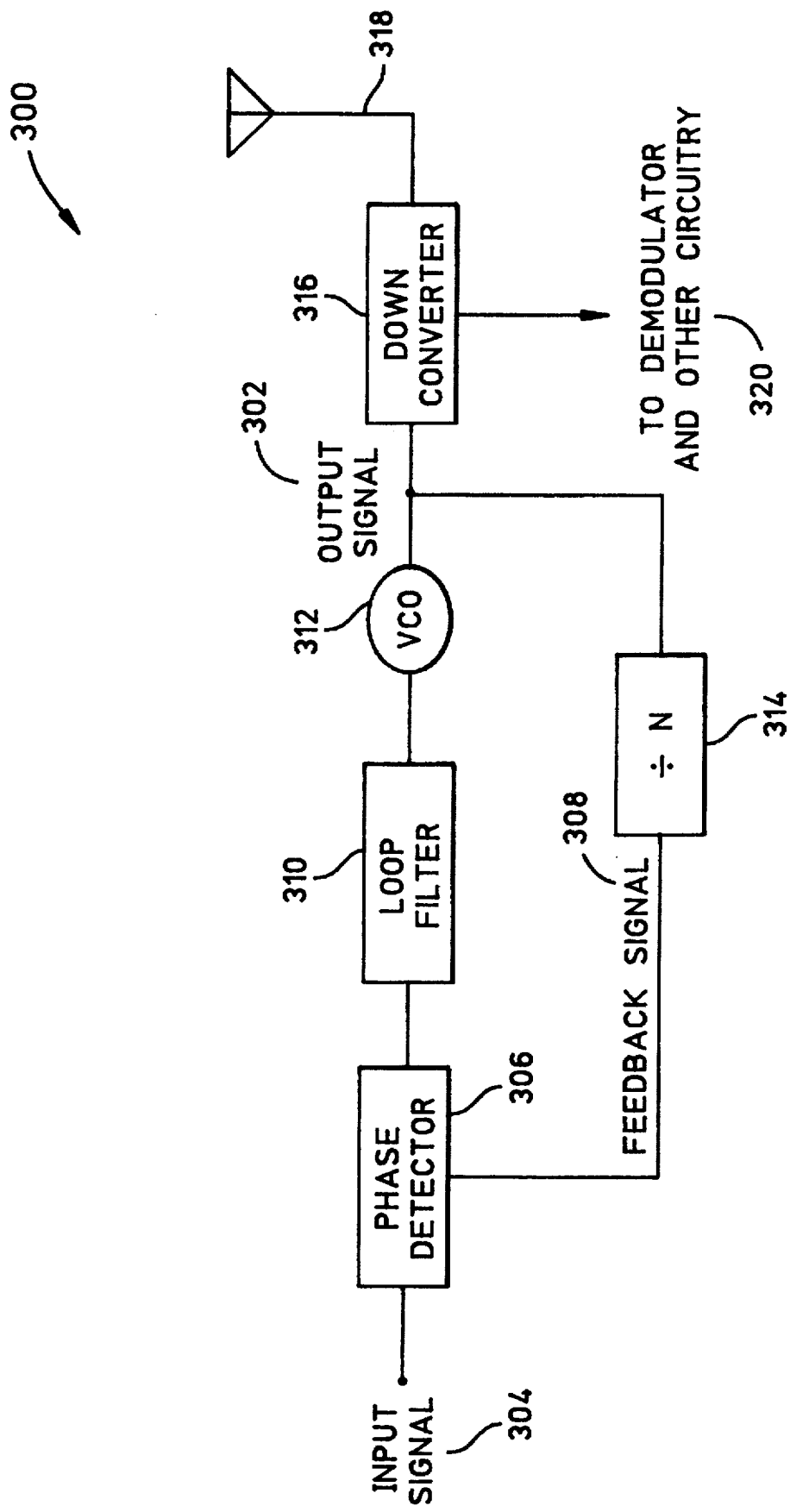
FIG. 3 is a block diagram of a typical PLL tuner 200.
Figure 4:
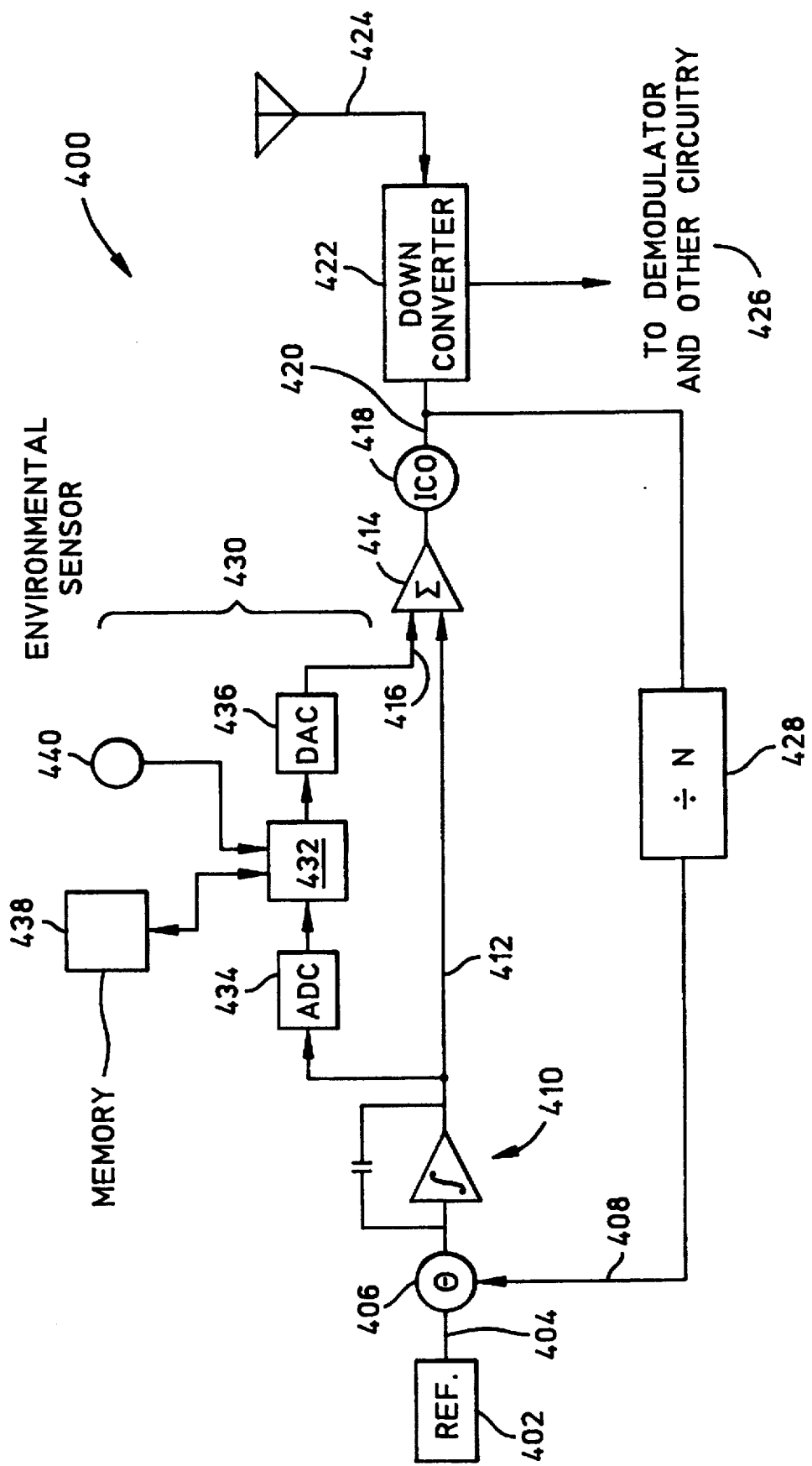
FIG. 4 is a block diagram of a self-calibrating radio tuner 400 in accordance with the present invention.

FIG. 4 illustrates a self-calibrating radio tuner 400 in accordance with the invention. As discussed in greater detail below, the radio tuner 400 provides early acquisition of desired radio signals, and automated self-calibration during ongoing operation of the radio. The tuner 400 includes a reference signal generator 402, which generates a reference signal on an output line 404. The reference signal, for example, may have a frequency of 10 MHz in a specific application. The reference signal generator 402 provides the reference signal to a phase detector 406, which calculates a phase difference between the signals on the output line 404 and feedback line 408 (discussed in greater detail below). An integrator 410 receives the phase difference signal from the phase detector 406, and sums the signal over time. The integrator 410 may comprise, for example, an operational amplifier with a feedback capacitor, as illustrated in FIG. 4. The integrator 410 provides an "error signal" upon a line 412, which constitutes one input to a summer 414. The summer 414 may comprise, for example, an appropriately configured operational amplifier to sum the error signal on the line 412 and an analog steering signal on a line 416 (discussed below). The summer 414 provides its output to an input-controlled oscillator ("ICO") 418, which provides an output signal on a line 420. This output signal has an "actual tune frequency" proportionate to the amplitude of the summer's output. Hence, the actual tune frequency is controlled by the magnitude of the ICO's input signal. As an example, the ICO 418 may comprise a VCO, responsive to a voltage signal provided by the summer 414.

The ICO 418 directs its output to a down converter 422 which uses this output to convert an electromagnetic signal received by an antenna 424 to an IF signal. The down converter 422 provides its output to a demodulator and other radio circuitry 426, which may comprise conventional radio circuitry. The ICO 418 also provides its output to a divider 428, which divides the ICO output signal by a predetermined "divisor", preferably an integer. The divider 428 therefore operates as a tune frequency selector, which may be operated manually (i.e., by a knob or other human operated control) or operated automatically by control circuitry. If the reference generator provides a 10 MHz signal, and a 100 MHz output signal is desired at the ICO 418, then the divider is adjusted to provide a "divide-by-10" function (i.e., the divisor is 10).

The tuner 400 also includes certain steering circuitry 430. Broadly, the steering circuitry 430 accomplishes dual purposes: (1) assisting the summer 414 in quickly and accurately providing its output to the ICO 418, and (2) during ongoing operation of the tuner 400, re-calibrating the output of the summer 414 by adaptively compensating for error that might arise from temperature changes and other factors. The steering circuitry 430 includes a logic unit 432 to carry out various high-level functions of the steering circuitry 430. The logic unit 432, for example, may comprise a microprocessor, a programmable logic array, an emitter-coupled logic device, or another suitable device. In the illustrated tuner 400, the logic unit 432 comprises a digital device. An ADC 434 provides the logic unit 432 with a digitized signal representative of the error signal. Through connections not shown, the logic unit 432 receives an indication of a "divisor" of the divider 428, i.e., the number that the divider 428 is using to divide the output signal 420 by. A DAC 436 creates analog signals representative of output signals from the logic unit 432, and provides these analog signals to the input line 416 of the summer 414.

The steering circuitry 430 additionally includes a memory 438, which may be electrically connected to the logic unit 432 or incorporated directly into the logic unit 432. The memory 438 comprises a rewritable memory, such as a PROM using gate array or EPLD logic. The memory 438 may also include a RAM component, to increase the speed with which data therein may be accessed. As discussed in greater detail below, the memory 438 provides certain stored data to the logic unit 432, for use in developing pre-steering signals or calibration signals, as appropriate. In one embodiment, the steering circuitry may also include an environmental sensor 440, electrically connected to the logic unit 432. The environmental sensor 440 may comprise, for example, a temperature sensor to sense ambient temperature. If the tuner 400 is operated in an airborne environment, for example, a temperature sensor 440 may provide especially relevant feedback to alert the logic unit 432 when the temperature proximate the tuner 400 has changed due to an altitude adjustment.

The logic unit 432 operates (as described more fully below) to develop a pre-steering signal, appropriate to the present operating conditions. Moreover, during ongoing operation of the tuner 400, the logic unit 432 additionally operates to detect a non-zero error signal from the integrator 410, and provide an appropriate corrective steering signal on the line 416.

OPERATION

Figure 5:
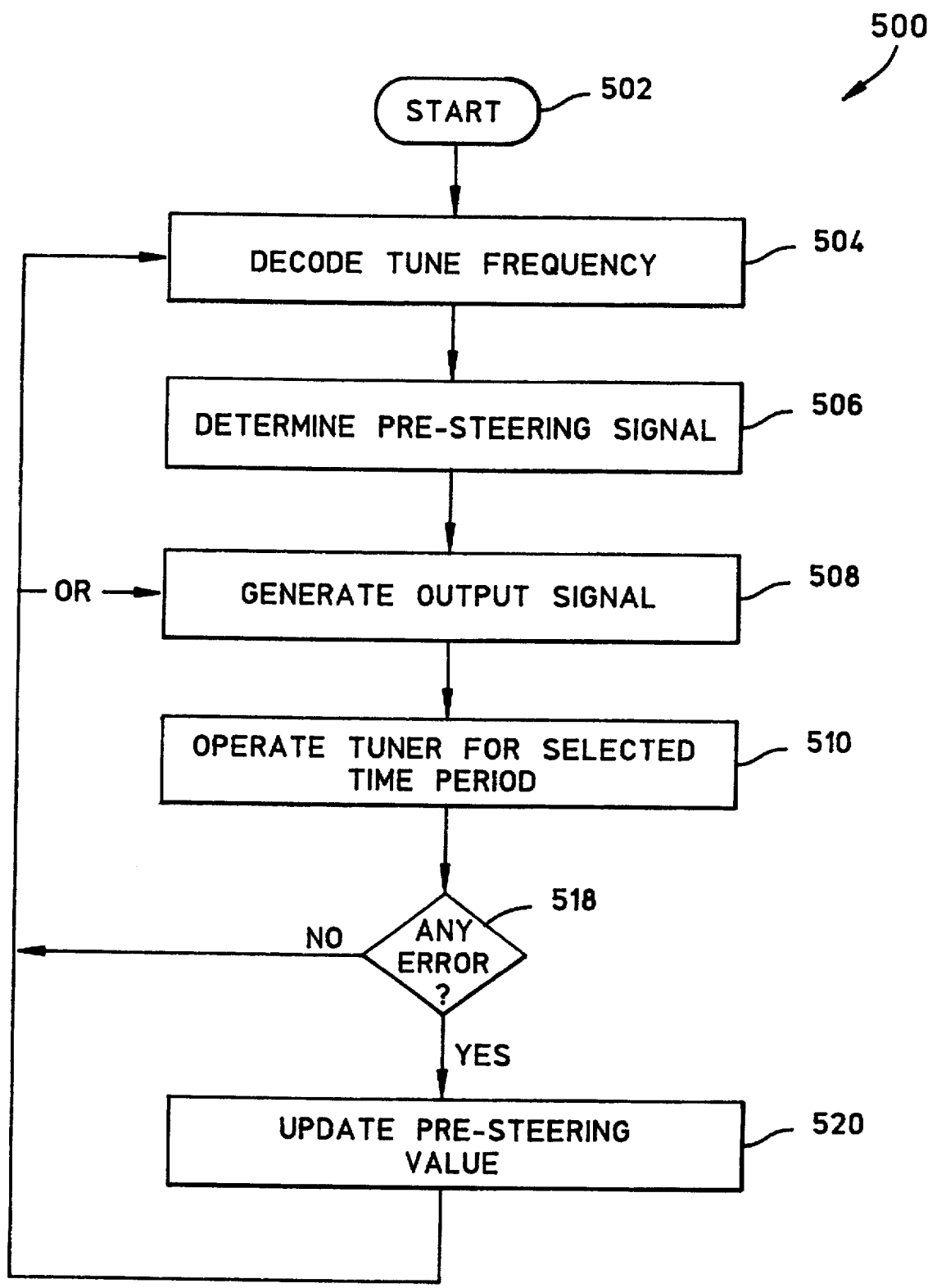
FIG. 5 is a flowchart of an exemplary sequence for operating a radio tuner in accordance with the invention.

In addition to the hardware components and interconnections described above, the present invention additionally includes a method of operating a radio tuner. This method may be carried out in a number of different embodiments. For the purpose of illustration, FIG. 5 describes an exemplary operational sequence 500 of the invention.

The routine 500 begins in task 502, which is initiated when the radio is first turned on or otherwise activated. Following task 502, the desired tune frequency is decoded in task 504, and then the logic unit 432 operates in task 506 to determine a pre-steering signal. Task 504 first "decodes" the desired tune frequency because the pre-steering values are stored in the memory 438 according to desired tune frequency. The logic unit 432, for example, may determine the desired tune frequency by multiplying the frequency of the reference generator 402 by the divisor of the divider 428. Alternatively, each pre-steering signal may be stored in association with a divisor, instead of a tune frequency to simplify the decoding step. After decoding, the logic unit 432 consults the lookup table in the memory 438 to obtain the appropriate pre-steering signal corresponding to the desired tune frequency (or divisor, if applicable). In other words, the logic unit 432 cross-references the desired tune frequency (or divisor) in the lookup table of the memory 438 to identify the proper pre-steering signal.

Additionally, if the environmental sensor 440 is used, each pre-steering signal may be selected by considering an additional criteria, such as temperature. In this embodiment, then, the task 506 identifies the appropriate pre-steering signal in the lookup table of the memory 438 by cross-referencing the desired tone frequency (or divisor, if appropriate) along with the additional criteria (eg., temperature).

With the pre-steering signal identified, task 508 then generates an appropriate output signal at the output line 420. Specifically, the logic unit 432 provides a digital representation of the pre-steering signal to the DAC 436, which provides a corresponding analog signal to the input line 416 of the summer 414. Simultaneously, the phase detector 406 measures the phase difference between the signals on lines 408 and 404, and the integrator 410 integrates the phase detector's output and provides its own output (the error signal) to the input line 412 of the summer. The summer 414 sums the signals on its input lines 416 and 412 to provide an output that determines the oscillation frequency of the ICO 418.

In task 510 the tuner 400 is operated for a selected period of time, while the ICO 418 provides the above-mentioned output signal on the line 420. During this time, query 518 determines whether the output of the integrator 410 is non-zero, i.e., whether there is any error between the feedback signal 408 and reference signal 404. Specifically, the ADC 434 samples the error signal on the line 412, which should optimally be zero during ongoing operation of the tuner 400. Therefore, in task 510 the logic unit 432 receives a digital representation of the signal present on the line 412.

If query 518 finds any error, task 520 updates the pre-steering value, seeking to reduce the error signal to zero. More particularly, in task 520 the logic unit 432 calculates a corrected steering signal which, when applied to the input line 416, will ultimately reduce the error signal on the output line 412 to zero. The logic unit 432 provides a digital representation of the corrected steering signal to the DAC 436, which provides an analog corrected steering signal to the summer 414, assisting in the ultimate generation of the output signal on the line 420. Also in task 520, the corrected pre-steering value is stored in the memory 438, for use the next time the same desired tune frequency (or divisor, if applicable) is selected. Therefore, next time this tune frequency (or divisor, if applicable) is selected, the actual tune frequency at the output 420 will match the desired tune frequency, with zero volts occurring at the output 412 of the integrator 410, thereby creating the fastest possible tuning times. After task 520 (or a negative answer to query 518), control returns to task 504, or optionally to task 508.

Preferably, the logic unit 432 stores the corrected steering signal itself in the memory 438, replacing the original pre-steering signal. This value is referenced by the associated tune frequency (or divisor, as appropriate). In this embodiment, the corrected steering signal comprises the original pre-steering signal added to or reduced by a correction factor. In this embodiment, the logic unit 432 simply reads the corrective steering value from the memory 438, and provides it to line 416 of the summer 414, via the DAC 436. Alternatively, the pre-steering signal may remain undisturbed in the memory 438, with the correction factor being stored independently in the memory 438, referenced by the same tune frequency (or divisor, if applicable) as the original tune frequency. Here, to obtain the proper corrected pre-steering value, the logic unit 432 reads the original pre-steering value and the independently stored correction factor from the memory 438. The logic unit 432 adds these values, and then provides them to line 416 of the summer 414 via the DAC 436.

While there have been shown what are presently considered to be preferred embodiments of the invention, it will be apparent to those skilled in the art that various changes and modifications can be made herein without departing from the scope of the invention as defined by the appended claims.

What is claimed is:

1. A self-calibrating radio tuner, comprising:
   a phase detector having first and second phase detector inputs and a phase detector output;
   an integrator having an integrator input coupled to the phase detector output and having an integrator output, said integrator receiving a phase output signal from the phase detector output and summing the phase output signal over time to provide on the integrator output an analog output signal representative of the phase output signal;
   a summer including first and second inputs, said first input coupled to the integrator output, said summer also having a summer output;
   an input-controlled oscillator ("ICO") having an input electrically connected to the summer output, said ICO also having an ICO output;
   a divider electrically interconnected between the ICO output and the first phase detector input;
   an analog-to-digital converter ("ADC") having an ADC input electrically connected to the integrator output and having an ADC output, said ADC receiving from the integrator output the analog output signal having an analog value and providing at the ADC output a digital signal representative of the analog value of the received analog output signal;
   a logic unit having a logic unit input interconnected to the ADC output and having a logic unit output; and
   a digital-to-analog converter ("DAC") having a DAC input electrically connected to the logic unit output and having a DAC output electrically connected to the summer's second input.

2. The radio tuner of claim 1, further comprising a down converter electrically connected to the ICO.

3. The radio tuner of claim 2, further comprising an antenna electrically connected to the down converter.

4. A self-calibrating radio tuner, comprising:
   a reference signal generator to generate a reference signal having a tune frequency;
   a phase detector connected to the reference signal generator to measure phase difference between the reference signal and a feedback signal received by the phase detector and to provide a representative output signal;
   an integrator coupled to the phase detector to sum the phase detector's output signal over time and provide a representative analog output signal on an integrator output;
   a summer coupled to the integrator output to sum the integrator's output with an analog steering signal received by the summer and provide a representative output signal;
   an input controlled oscillator ("ICO") electrically connected to the summer to provide an output signal with an actual tune frequency proportionate to the summer's output signal;
   a divider electrically interconnected between the ICO and the phase detector to selectably determine a desired tune frequency;
   an analog-to-digital converter ("ADC") coupled to the integrator output and having an ADC output, to receive the analog output signal having an analog value from the integrator output and provide at the ADC output a digital error signal representative of the analog value of the received analog output signal;
   a digital-to-analog converter ("DAC") having a DAC output coupled to the summer and also having a DAC input, the DAC providing at the DAC output the analog steering signal proportional to a digital input signal received at the DAC input;
   a memory containing electrical representations of steering signals associated with specific reference signals and temperatures; and
   a logic unit interconnected to the ADC output, the memory, and the DAC, programmed to perform method steps to select the analog steering signal, said method steps comprising the steps of:
      selecting an analog pre-steering signal by retrieving from the memory an analog steering signal referenced according to the desired tune frequency;
      providing the selected analog pre-steering signal to the DAC input for a selected time period;
      in response to the digital signal representative of the analog value of the received analog signal, selecting a corrected steering signal to minimize the error signal; and
      after operation of the radio tuner for a selected time period, providing the corrected steering signal to the DAC input.

5. The radio tuner of claim 4, wherein the logic unit comprises a microprocessor.

6. The radio tuner of claim 5, wherein the logic unit further includes a memory.

7. The radio tuner of claim 4, wherein the logic unit comprises a programmable logic array.

8. The radio tuner of claim 4, wherein the logic unit comprises an emitter-coupled logic circuit.

9. The radio tuner of claim 4, wherein the logic unit includes an electrically programmable circuit.

10. The radio tuner of claim 4, wherein the logic unit is embodied in Gallium Arsenide circuitry.

11. The radio tuner of claim 4, further comprising a down converter electrically connected to the ICO.

12. The radio tuner of claim 11, further comprising an antenna electrically connected to the down converter.

13. A method for operating a self-calibrating radio tuner, comprising the steps of:

generating a reference signal;

frequency dividing an output signal having an actual tune frequency by a division to generate a feedback signal;

measuring a phase difference between the reference signal and the feedback signal and providing a representative phase difference signal;

summing the phase difference signal over time and providing a representative error signal;

summing the error signal with a steering signal to provide a control signal;

providing the output signal by creating a signal with a frequency proportionate to the control signal; and generating the steering signal by performing steps comprising:

generating a steering signal in response to the division; and after operation of the radio tuner for a selected time period generating a corrected steering signal responsive to the error signal to minimize the error signal.

14. The method of claim 13, wherein the step of generating a corrected steering signal further comprises the steps of storing the corrected steering signal.

15. The method of claim 13, wherein the steering signal comprises a digital signal, and the method further comprises the steps of converting the digital steering signal to an analog signal.

16. The method of claim 13, wherein the steering signal comprises an analog signal.

17. The method of claim 13, wherein the step of generating the steering signal comprises the steps of:

generating a pre-steering signal in response to the division;

after operation of the radio tuner for a selected time period, determining whether any change has occurred in the desired tune frequency;

generating a corrected steering signal to minimize the error signal; and repeating the above-mentioned steps.

18. The method of claim 13, wherein the of step generating the steering signal comprises the steps of:

generating a pre-steering signal in response to an initial temperature and initial reference signal;

sensing the present temperature and reference signal;

in response to a change in the temperature or the desired tune frequency, re-generating pre-steering signal in accordance with the sensed temperature and the desired tune frequency; and after operation of the radio tuner for a selected time period without any change in temperature or desired tone frequency, generating a corrected steering signal to minimize the error signal.

* * * * *